US008208343B2

(12) United States Patent
Martin et al.

(10) Patent No.: US 8,208,343 B2
(45) Date of Patent: Jun. 26, 2012

(54) ACOUSTIC RANGING BY APPLICATION OF LINEAR PERIOD MODULATED SOUND

(75) Inventors: James Martin, Cottenham (GB); Kambiz Iranpour, Oslo (NO)

(73) Assignee: WesternGeco L.L.C., Houston, TX (US)

( * ) Notice: Subject to any disclaimer, the term of this patent is extended or adjusted under 35 U.S.C. 154(b) by 1751 days.

(21) Appl. No.: 10/529,192

(22) PCT Filed: Oct. 13, 2003

(86) PCT No.: PCT/GB03/04452
§ 371 (c)(1),
(2), (4) Date: Oct. 11, 2005

(87) PCT Pub. No.: WO2004/036253
PCT Pub. Date: Apr. 29, 2004

(65) Prior Publication Data
US 2006/0187753 A1    Aug. 24, 2006

(30) Foreign Application Priority Data
Oct. 12, 2002   (GB) .................................. 0223843.4

(51) Int. Cl.
*G01V 1/38* (2006.01)
(52) U.S. Cl. ....................................................... 367/127
(58) Field of Classification Search .................. 367/127, 367/129, 130
See application file for complete search history.

(56) References Cited

U.S. PATENT DOCUMENTS

| 4,641,287 A | | 2/1987 | Neeley ............................. 367/19 |
| 5,142,507 A | * | 8/1992 | Rouquette ..................... 367/134 |
| 5,359,575 A | | 10/1994 | Williams et al. .............. 367/127 |
| 6,049,507 A | | 4/2000 | Allen .............................. 367/21 |

FOREIGN PATENT DOCUMENTS

| EP | 0 504 702 | 9/1992 |
| WO | WO 9419707 | 9/1994 |

OTHER PUBLICATIONS

Altes R. A., "Radar/Sonar Acceleration Estimation with Linear Period Modulated Waveforms", IEEE Transactions on Aerospace and Electronics Systems, vol. 26, No. 6, Nov. 1990.*
Ashley et al, "Own Doppler Nullification (ODN) in Sonars using Linear Period Modulated (LPM) Wideband Signals", IEEE Pacific Rim Conference on Communications, Computers and Signal Processing, Jun. 1989.*
Dragoset, "Marine vibrations and the Doppler effect," *Geophysics*, 53(1): 1388-98, Nov. 1998.
UK Search Report dated Feb. 13, 2003, for Application No. GB 0223843.4.
International Search Report PCT/GB 03/04452 dated Jan. 30, 2004.

* cited by examiner

*Primary Examiner* — Ian Lobo

(57) ABSTRACT

A method and apparatus is provided for acoustic ranging by application of linear period modulated sound. In one aspect of the instant invention, an apparatus is provided for acoustic ranging by application of linear period modulated sound. The apparatus includes at least one source adapted to generate at least one modulated Doppler invariant signal and at least one receiver deployed along a seismic sensing cable, wherein the receiver is adapted to receive at least one modulated Doppler invariant signal from the at least one source. The apparatus further includes a signal processing unit adapted to determine the propagation time delay between the source and the receiver using the modulated Doppler invariant signal and the received Doppler invariant signal.

25 Claims, 5 Drawing Sheets

ACOUSTIC RANGING BY APPLICATION OF LINEAR PERIOD MODULATED SOUND

FIELD OF THE INVENTION

This invention relates generally to acoustic ranging, and, more particularly, to acoustic ranging by the application of linear period modulated sound.

DESCRIPTION OF THE RELATED ART

Underwater seismic exploration is widely used to locate and/or survey subterranean geological formations for hydrocarbon deposits. A survey typically involves deploying one or more seismic sources and one or more seismic sensors at predetermined locations. For example, a seismic cable including an array of seismic sensors may be deployed on the sea floor and a seismic source may be towed along the ocean's surface by a survey vessel. The seismic sources generate acoustic waves that travel to the geological formations, where they are reflected and propagate back to the seismic sensors. The seismic sensors receive the reflected waves, which are then processed to generate seismic data. Analysis of the seismic data may indicate probable locations of geological formations and hydrocarbon deposits.

The accuracy of the seismic analysis may be limited by uncertainties in the seismic source and sensor positions. The positions of deployed seismic sources and seismic sensors may be estimated using modelling techniques that predict the position of the deployed seismic sources. For example, the position of a seismic cable on the sea floor may be estimated using models that consider the physical characteristics of the seismic cable (e.g., weight, diameter, etc.) and the effect of predicted sea currents on the seismic cable as it descends to the sea floor. However, such methods are predicated on a limited knowledge of the properties of water in the catenary, as well as the geology of the sea floor, and thus they only provide an estimate of the seismic cable's location.

A variety of measurement techniques have been developed to determine the position of the seismic sources and the seismic sensors as the seismic sensors descend through the catenary and come to rest on the sea floor. One such technique is time delay estimation, which determines the positions of arrays of seismic sources and seismic sensors by measuring the time it takes for a signal, such as a chirp, to travel between the seismic sources and seismic sensors. For example, an acoustic source may be deployed on a buoy at the sea surface. One or more receivers may be deployed along a seismic cable resting on the sea floor. The distance between the acoustic source and the receivers, and, consequently, the position of the seismic cable, may be determined by cross-correlating the chirp emitted by the acoustic source with the signal received by the receivers. The cross-correlation produces a peak in the cross-correlation estimate that corresponds to a time lag caused by propagation of the chirp from the acoustic source to the receivers.

The ocean's surface, however, is not an ideal platform for the acoustic sources and/or receivers that are used in time delay estimation. Movement of the acoustic source and/or receiver as it rides the rough sea surface may introduce Doppler shifts into the frequency spectrum of the chirp, which may degrade the cross-correlation estimates. Even moderately heavy seas with a significant wave height (SWH) of about 8 meters may accelerate a buoy or vessel to velocities of about 2-3 meters per second. The resulting Doppler shift may destroy the peak in the cross-correlation estimate in up to 60% of the attempted measurements. Similarly, the motion of the seismic cable may degrade the cross-correlation estimates, making it difficult to determine the location of the seismic cable as it descends through the catenary to the sea floor.

SUMMARY OF THE INVENTION

In one aspect of the instant invention, an apparatus is provided for acoustic ranging by application of linear period modulated sound. The apparatus includes at least one source adapted to generate at least one modulated Doppler invariant signal and at least one receiver deployed along a seismic sensing cable, wherein the receiver is adapted to receive at least one modulated Doppler invariant signal from the at least one source. The apparatus further includes a signal processing unit adapted to determine the propagation time delay between the source and the receiver using the modulated Doppler invariant signal and the received Doppler invariant signal.

In one aspect of the present invention, a method is provided for acoustic ranging by application of linear period modulated sound. The method includes generating at least one modulated Doppler invariant signal using at least one source and receiving the at least one modulated Doppler invariant signal with at least one receiver positioned along a seismic cable. The method further includes determining at least one propagation time delay from the source to the receiver using the modulated Doppler invariant signal and the received Doppler invariant signal.

BRIEF DESCRIPTION OF THE DRAWINGS

The invention may be understood by reference to the following description taken in conjunction with the accompanying drawings, in which like reference numerals identify like elements, and in which.

Figure 1A:
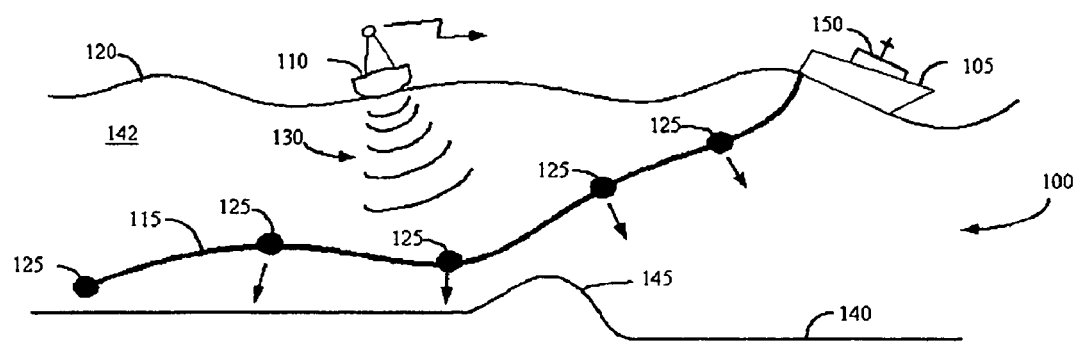
FIGS. 1A-C each show aspects of a first exemplary system for acoustic ranging, in accordance with a first embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1B:
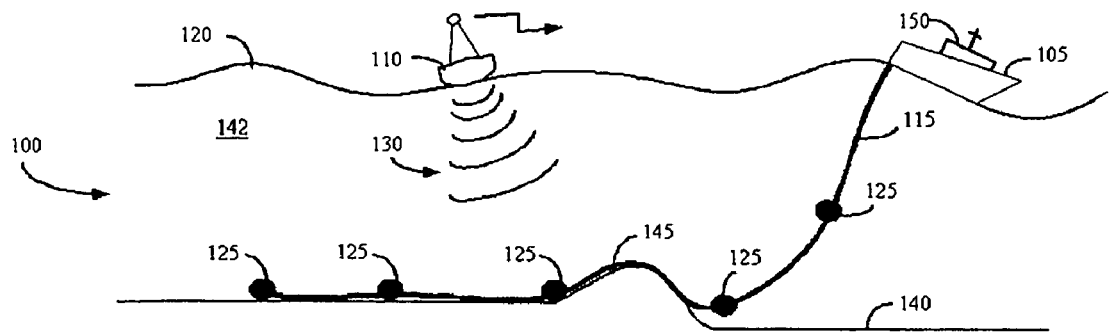

Referring now to FIGS. 1A-B, a first exemplary system 100 for acoustic ranging is shown. In the illustrated embodiment, the first exemplary system 100 includes, but is not limited to, a survey vessel 105, a source 110, and a seismic cable 115. The survey vessel 105 may be deployed at a surface of a body of water 142, which, in alternative embodiments, may be freshwater, sea water, or brackish water. Similarly, the source 110 may be deployed in any desirable manner at or near the surface 120 of the body of water 142. For example, the source 110 may be mounted on the survey vessel 105, suspended beneath a buoy, towed behind a second vessel, or deployed in any like manner. It will further be appreciated that more than one source 110 may be deployed without departing from the scope of the present invention.

The seismic cable 115 includes one or more sensors 125. The sensors 125 receive a variety of signals, including, but not limited to acoustic signals, seismic signals (not shown), and the like. In particular, the sensors 125 may receive acoustic signals 130 generated by the source 110. The sensors 125 may also receive reflected seismic signals (not shown) that may be analysed to locate and/or survey geologic formations such as hydrocarbon deposits. The seismic cable 115 may be deployed from the survey vessel 105 by any of a variety of means well-known to those of ordinary skill in the art, including, but not limited to, spooling the seismic cable 115 from the stern of the survey vessel 105 as the survey vessel 105 moves across the surface 120 of the body of water 142. In one embodiment, as the seismic cable 115 is being deployed, the seismic cable 115 descends through the catenary until it reaches the floor 140 of the body of water 142.

The size and shape of the seismic cable 115, currents in the body of water 142, and other like factors may influence the path that the seismic cable 115 takes on its descent through the catenary. For example, and as illustrated by the arrows in FIG. 1A, portions of the seismic cable 115 may descend at different speeds and in different directions. Although FIG. 1A only shows the vertical variations in the rate of descent and position of the seismic cable 115, it will be appreciated that an actual seismic cable 115 may also move horizontally and that the horizontal motion and position of the seismic cable 115 may vary along the length of the seismic cable 115. Similarly, irregularities in a floor 140 under the body of water 142, such as a bump 145 shown in FIGS. 1A-B, may influence the position of the seismic cable 115 as it rests upon the floor 140.

The conditions in the body of water 142, as well as the geometry of the floor 140, may not be known in advance. These unknown and/or unforeseen conditions may determine the path of the seismic cable 115 as it descends through the catenary and the position of the seismic cable 115 as it rests upon the floor 140. Consequently, it may not be possible to predict the exact location of the seismic cable 115 during and after deployment. The accuracy of seismic surveys may, however, depend upon an accurate knowledge of the location of the seismic cable 115.

To determine the position of the seismic cable 115, the source 110 may generate at least one acoustic signal 130 that may be received by the one or more sensors 125 positioned along the seismic cable 115. The received signal and the acoustic signal 130 may then be communicated to a signal processing unit 150. For example, in one embodiment, the source 110 and/or the sensors 125 may communicate the received signal and the acoustic signal 130 to the signal processing unit 150 via a data telemetry unit (not shown) included in the source 110 and/or the sensors 125. However, in alternative embodiments, the received signal and the acoustic signal 130 may be communicated to the signal processing unit 150 by any desirable means such as radio-frequency transmissions, optical devices, and the like.

The signal processing unit 150 may form a cross-correlation estimate by cross-correlating the received signal and the acoustic signal 130 in a conventional manner well-known to those of ordinary skill in the art having benefit of the present disclosure. As discussed in more detail below, a peak in the cross-correlation estimate corresponding to a propagation time lag may be used to determine the location of the seismic cable 115. Although the signal processing unit 150 depicted in FIGS. 1A-B is positioned on the vessel 105, the present invention is not so limited. In alternative embodiments, portions of the signal processing unit 150 may be positioned in the seismic cable 115, on the source 110, on the survey vessel 105, or at any other desirable location without departing from the scope of the present invention.

Figure 1C:
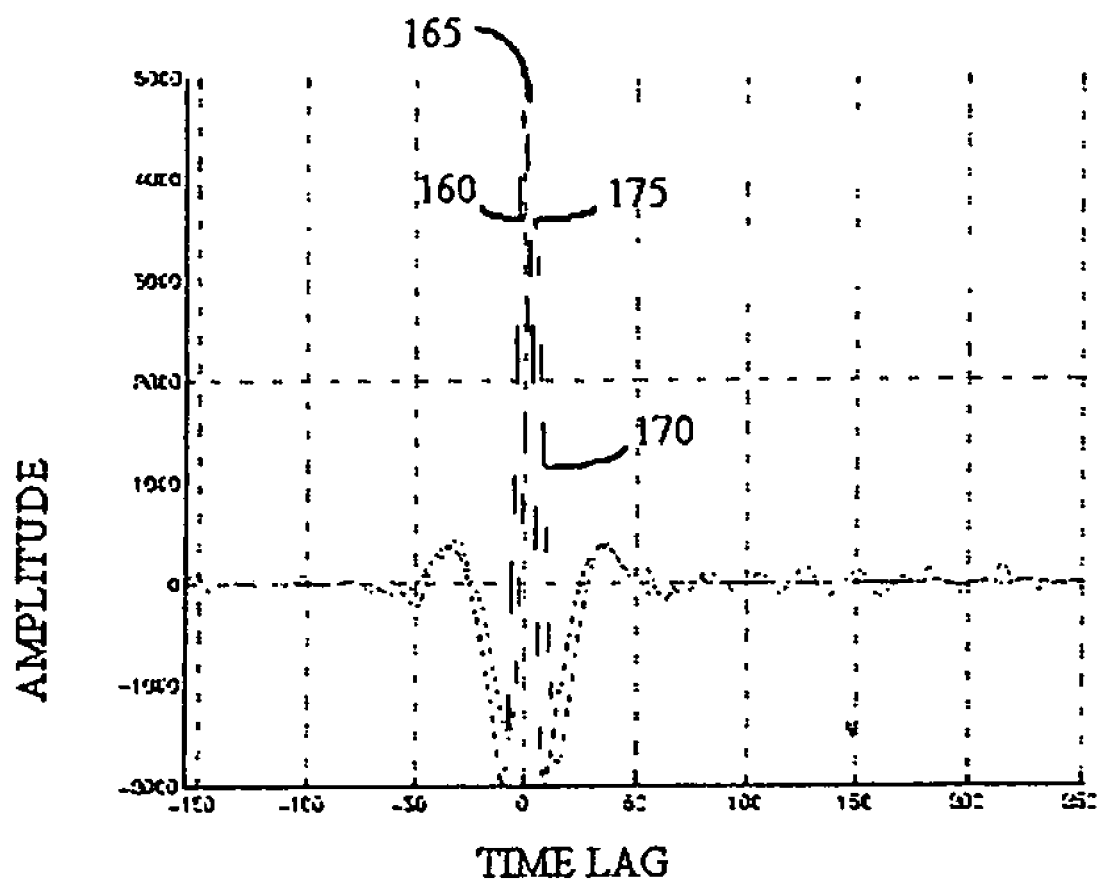

As was mentioned earlier, movement of the source 110, the survey vessel 105, the cable 115, and/or the sensors 125 may make it difficult to cross-correlate the received signal and the acoustic signal 130. In particular, the movement may Doppler shift the frequencies of the received signal and/or the acoustic signal 130 and degrade the correlation coefficient. For example, FIG. 1C shows a model cross-correlation estimate 160 calculated with stationary sources and sensors. A peak 165 is evident at a time lag of zero. A second correlation coefficient 170 is calculated including a Doppler shift, and a peak 175 is evident at a non-zero time lag. The amplitude of the peak 175 is reduced relative to the peak 165 because of the Doppler shift.

In some instances, the Doppler shift may degrade the cross-correlation to such an extent that it may not be possible to determine the position of the seismic cable 115. For example, in moderately heavy seas, the Doppler shift may make it impossible to determine the position of the peak of the cross-correlation in up to 60% of the attempted measurements. Thus, in accordance with one embodiment of the present invention, the source 110 may provide at least one Doppler invariant acoustic signal 130, as described in more detail below. However, it will be appreciated by those of ordinary skill in the art having benefit of the present disclosure, that the acoustic signal 130 need not necessarily be perfectly Doppler invariant to perform the function desired in the present invention. Thus, the term "Doppler invariant signal" will be understood to include signals that are perfectly Doppler invariant, as well as signals that are sufficiently Doppler invariant to allow the peak in the correlation coefficient to be determined over a desirable range of relative velocities and for a selected frequency of the acoustic signal 130.

Figure 2A:
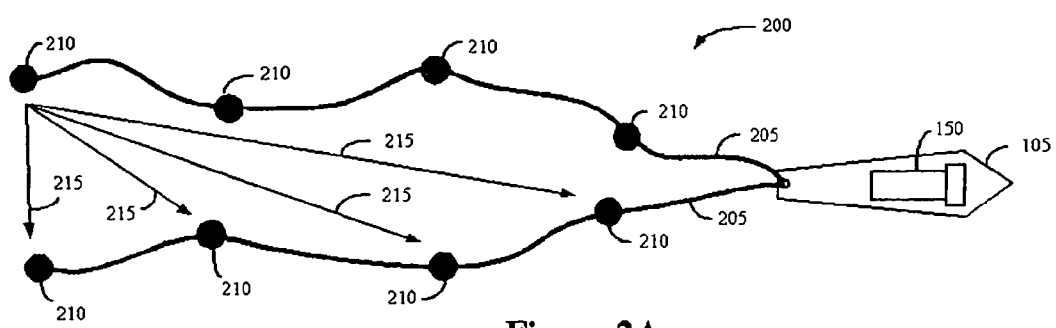
FIGS. 2A-B each show aspects of a second exemplary system for acoustic ranging, in accordance with a second embodiment of the present invention alternative to that in FIGS. 1A-C.
Figure 2B:
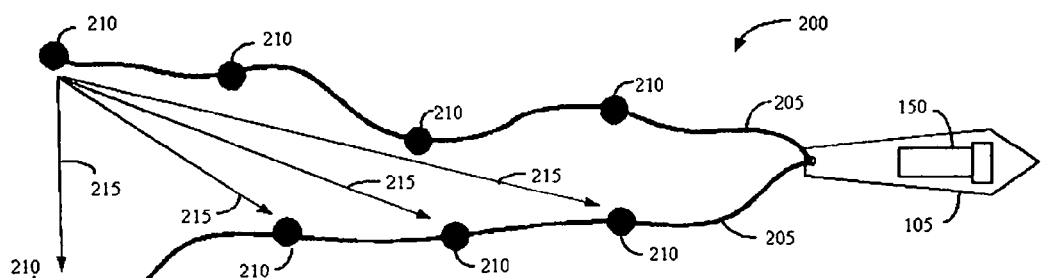

Referring now to FIGS. 2A-B, a second exemplary system 200 for acoustic ranging is shown. The survey vessel 105 in the second exemplary system 200 may, in one embodiment, deploy a plurality of streamer cables 205 at or near the surface 120 of a body of water 142, which, in alternative embodiments, may be freshwater, sea water, or brackish water. In alternative embodiments, the streamer cables 205 may be deployed below the surface of the body of water 142. Although two streamer cables 205 are shown in FIGS. 2A-B, the present invention is not so limited. In alternative embodiments, more or fewer streamer cables 205 may be deployed without departing from the scope of the present invention.

A plurality of transceivers 210 may be coupled to the streamer cables 205. As with the first embodiment illustrated in FIGS. 1A-C, the transceivers 210 may, in one embodiment, generate acoustic signals 215, transmit acoustic signals 215 to other transceivers 210, and receive acoustic signals 215 from other transceivers 210. However, it will be appreciated that the functions of generating, transmitting, and receiving need not be embodied in a single device. In alterative embodiments, the transceivers 210 may include independent devices (not shown) for generating, transmitting, and receiving. The streamer cables 205 may be deployed by any desirable means including, but not limited to, spooling the streamer cables 205 from the stem of the survey vessel 105.

During and after deployment of the streamer cables 205, the size and shape of the streamer cable 205, currents in the body of water 142, the velocity of the survey vessel 105, and other like factors may cause the streamer cable 205 to move unpredictably through the water, as shown in FIGS. 2A-B. The accuracy of measurements made by various devices (not shown) attached to the streamer cables 205 may, however, depend upon an accurate knowledge of the relative position of the plurality of the streamer cables 205 and/or the absolute position of the streamer cables 205. Thus, the generated and received acoustic signal 215 may be communicated to the signal processing unit 150. For example, the transceivers 210 may communicate the generated and received acoustic signals 215 to the signal processing unit 150 via a data telemetry unit (not shown) included in the transceivers 210.

The signal processing unit 150 may determine the relative and/or absolute locations of the streamer cables 205 by cross-correlating the generated and received acoustic signals 215. Although the signal processing unit 150 depicted in FIGS. 1A-B and 2A-B is positioned on the survey vessel 105, the present invention is not so limited. In alternative embodiments, portions of the signal processing unit 150 may be positioned in the transceivers 210, the streamer cables 205, on the survey vessel 105, or at any other desirable location without departing from the scope of the present invention.

Motions of the transceivers 210, the survey vessel 105, and the streamer cables 205 may, however, make it difficult to cross-correlate the generated and received acoustic signals 215. In particular, the motions may Doppler shift the frequencies of the acoustic signals 215, which may degrade the cross-correlation to such an extent that it may not be possible to determine the relative and/or absolute positions of the streamer cables 205. Thus, in accordance with one embodiment of the present invention, the transceivers 210 may generate at least one modulated Doppler invariant acoustic signal 215, as described in more detail below.

Figure 3A:
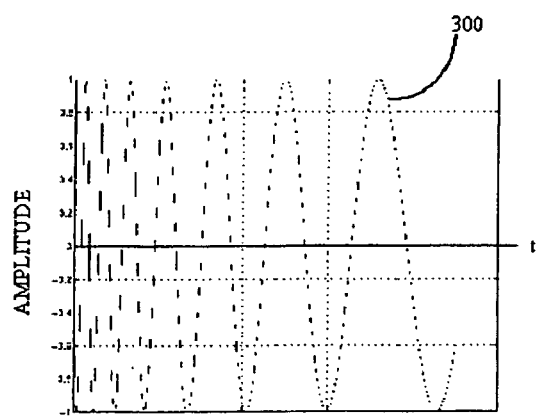
FIGS. 3A-B show a linear-period-modulated (LPM) chirp that may be used by the systems shown in FIGS. 1 and 2, in accordance with one embodiment of the present invention.

Virtually any Doppler invariant signal now known or known in the future to the art may be used. FIG. 3A shows a Doppler invariant signal 300, in accordance with one embodiment of the present invention. The Doppler invariant signal 300 shown in the illustrated embodiment is a so-called linear-period-modulated (LPM) chirp. However, the present invention is not so limited. Any desirable Doppler invariant signal 300 may be used without departing from the scope of the present invention.

Figure 3B:
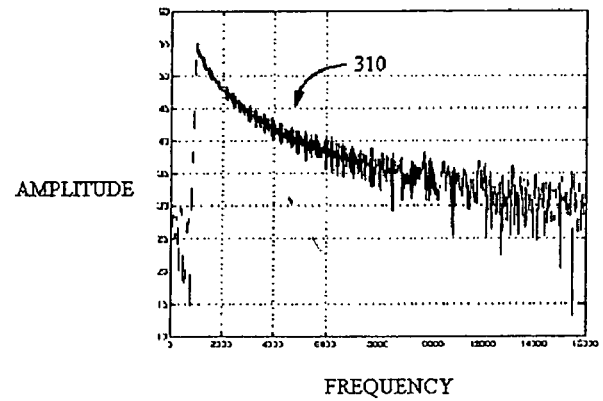

The LPM chirp 300 may be described by the mathematical formula, $u(t)=a(t).\exp\{j(\Omega \ln t+\Omega_0)\}$, for times $t>0$, where $\Omega$ and $\Omega_0$ are arbitrary real variables that may be used to determine the time-frequency structure of the signal, and $a(t)$ denotes an envelope function. As will be appreciated by those skilled in the art having the benefit of this disclosure, the instantaneous frequency of the LPM chirp 300 may therefore be described as:

$$\omega = \frac{d(\Omega \ln t + \Omega_0)}{dt} = \frac{\Omega}{t}$$

when the envelope function a(t) is slowly varying. The instantaneous frequency of the LPM chirp 300 decreases linearly with time t and, consequently, the instantaneous period of the LPM chirp 300 increases linearly with time t. FIG. 3B shows the frequency spectrum 310 of the LPM chirp 300. In the illustrated embodiment, the bandwidth of the LPM chirp 300 is about 16 kHz and the duration of the LPM chirp 300 is about 4 seconds.

The Doppler invariance of the LPM chirp 300 may be demonstrated using a simple model. A first signal, u(t), may be generated and emitted by, for example, the source 110 of FIGS. 1A-B or the transceivers 210 of FIGS. 2A-B and may produce a second signal, e(t), that may be received by, for example, the sensors 125 of FIGS. 1A-B or the transceivers 210 of FIGS. 2A-B, which may be positioned at a distance $r_0$ from the source 110 or transceivers 210. The relative velocity between the source 110 and the sensors 125, or the transceivers 210, is $v_0$. In the aforementioned model, the relation $e(t)=\sqrt{s_0}.u(s_0.(t-\tau_0))$ holds, where $s_0$ is a temporal dilation factor due to the Doppler shift and $\tau_0$ is a round trip time. Analytic expressions for $s_0$ and $\tau_0$ are:

$$\tau_0 = \frac{2r_0}{c};$$

and $$s_0 = \frac{c-v_0}{c+v_0},$$

where c is the velocity of sound. For $\sqrt{s_0} \approx 1$ and assuming that u(t), e(t) are produced by the LPM chirp 300, the relation becomes $e(t) \approx \exp(j\Omega \ln s_0).u(t-\tau_0)$, i.e., the signal is Doppler invariant in the sense described above, if the envelope function is slowly varying such that the effect of the temporal dilation on the envelope function a(t) is negligible. Incorporating the aforementioned approximations, the cross-correlation function $\phi_{eu}(t)$ becomes $\phi_{eu}(t)=\exp(j\Omega \ln s_0).\phi_{uu}(t-\tau_0)$, where $\phi_{uu}(t-\tau_0)$ is the auto-correlation function. Thus, the cross-correlation $\phi_{eu}$ has a peak at $\tau=\tau_0$ and the auto-correlation $\phi_{uu}$ has a peak at $\tau=0$, as expected for a Doppler invariant signal.

Referring back to FIGS. 1A-B and 2A-B, the source 110 and/or the transceivers 210 may generate a plurality of modulated Doppler invariant acoustic signals 130, 215. In one embodiment, the plurality of modulated Doppler invariant signals 130, 215 are separable. For example, each of the plurality of modulated Doppler invariant acoustic signals 130, 215 may be modulated by a sequence to form an orthogonal Doppler invariant acoustic signal 130, 215, which may be transmitted and/or received while other orthogonal Doppler invariant acoustic signals 130, 215 are also being transmitted and/or received. In particular, the plurality of orthogonal Doppler invariant acoustic signals 130, 215 may be transmitted and/or received simultaneously.

In one embodiment, a spread spectrum sequence such as Maximal sequence may be used to form the orthogonal Doppler invariant acoustic signal 130, 215. The Maximal sequence may include a plurality of elements and each element in the Maximal sequence may be a +1 or a −1. By selecting an appropriate series of elements and then applying the Maximal sequence as an envelope function to modulate the Doppler invariant acoustic signal 130, 215 in a manner well-known in the art having the benefit of this disclosure, the orthogonal Doppler invariant acoustic signals 130, 215 may be generated. In alternative embodiments, any desirable sequence, such as a Kasami sequence, may be used as the envelope function to form the orthogonal Doppler invariant acoustic signals 130, 215 without departing from the scope of the present invention.

Sequences in general, and Maximal and Kasami sequences in particular, are not necessarily Doppler invariant, as will be appreciated by those of ordinary skill in the art having the benefit of this disclosure. However, as discussed above, if the envelope function is slowly varying such that the effect of Doppler shift on the envelope function is negligible, the orthogonal acoustic signals 130, 215 may be Doppler invariant, as the term is understood in the present application. For example, a Maximal sequence including 255 elements has been determined to be slowly varying such that the effect of Doppler shift on the envelope function is negligible and the orthogonal acoustic signals 130, 215 that result from applying the envelope function are Doppler invariant for the velocities of interest. In contrast, the effect of Doppler shift on the envelope function formed using a Maximal sequence including 1023 elements may, in some embodiments, have an undesirable effect on the Doppler invariance of the orthogonal acoustic signals 130, 215.

Figure 4:
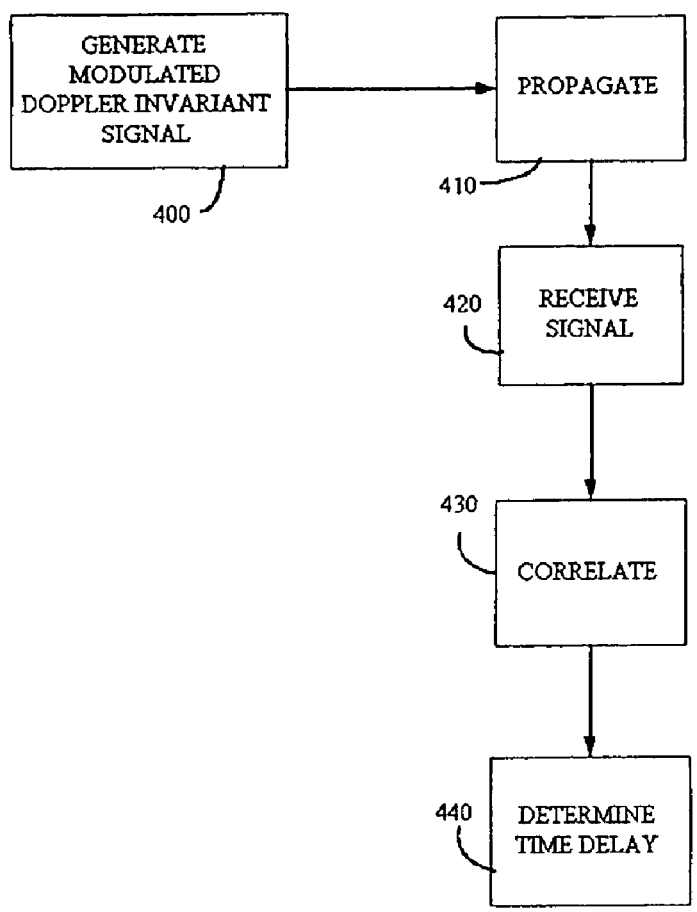
FIG. 4 shows a method of acoustic ranging, in accordance with one embodiment of the present invention.

FIG. 4 shows a method of acoustic ranging, in accordance with one embodiment of the present invention. The source 10 and/or transceivers 210 generate (at 400) the modulated Doppler invariant acoustic signal 130, 215. If it is desirable to provide one or more orthogonal Doppler invariant acoustic signals 130, 215, then the modulated Doppler invariant acoustic signal 130, 215 may be modulated by an orthogonal sequence. For example, as discussed above, the modulated Doppler invariant acoustic signal 130, 215 may be modulated by a Maximal sequence, a Kasami sequence, and the like. The modulated Doppler invariant acoustic signals 130, 215 then propagate (at 410) to the sensors 125 and/or the transceivers 210.

The sensors 125 and/or the transceivers 210 receive (at 420) the modulated Doppler invariant acoustic signals 130, 215. The received modulated Doppler invariant acoustic signals 130, 215 are then provided to the signal processing unit 150, which correlates (at 430) the generated and received modulated Doppler invariant signals 130, 215. For example, in one embodiment, the signal processing unit 150 cross-correlates (at 430) the generated and received modulated Doppler invariant signals 130, 210. The signal processing 150 unit then uses the correlated signals to determine (at 440) a propagation time delay between the source 110, the sensors 125, and/or the transceivers 210, as discussed in detail above.

By using the modulated Doppler invariant signal 130, 215, or a plurality of modulated Doppler invariant signals 130, 215, in the manner described above, the performance of acoustic ranging systems, such as the first exemplary system 100 and the second exemplary system 200, may be improved. For example, up to 100% of the LPM chirps 300 may be used to calculate the cross-correlation estimate during acoustic ranging in rough seas having at least a significant wave height (SWH) of about 8 meters, which may accelerate a buoy or vessel to velocities of at least about 2-3 meters per second.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. An apparatus for determining a propagation time delay, comprising:
at least one source adapted to generate a plurality of separable, modulated Doppler invariant signals;
at least one receiver deployed along a seismic sensing cable, wherein the receiver is adapted to receive at least one modulated Doppler invariant signal from the at least one source; and
a signal processing unit adapted to determine the propagation time delay between the source and the receiver using the modulated Doppler invariant signal and the received modulated Doppler invariant signal.

2. The apparatus of claim 1, wherein the modulated Doppler invariant signals are modulated linear-period-modulated signals.

3. The apparatus of claim 2, wherein the modulated linear-period-modulated signals have a bandwidth of about 16 kHz and a temporal duration of about 0.25 seconds.

4. The apparatus of claim 1, wherein the signal processing unit is adapted to determine the propagation time delay between the source and the receiver by cross-correlating one of the modulated Doppler invariant signals and the received modulated Doppler invariant signal.

5. The apparatus of claim 4, wherein the signal processing unit is adapted to determine the propagation time delay between the source and the receiver by auto-correlating the modulated Doppler invariant signal.

6. The apparatus of claim 1, wherein the at least one source is adapted to generate the plurality of separable Doppler invariant signals as a plurality of orthogonal Doppler invariant signals.

7. The apparatus of claim 6, wherein the at least one source is adapted to generate the plurality of orthogonal Doppler invariant signals using a plurality of orthogonal sequences.

8. The apparatus of claim 7, wherein the plurality of orthogonal sequences are at least one of a plurality of Maximal sequences and a plurality of Kasami sequences.

9. The apparatus of claim 1, wherein the at least one source is adapted to generate the plurality of separable Doppler invariant signals substantially simultaneously.

10. The method of claim 1, wherein the at least one source is adapted to generate the plurality of separable Doppler invariant signals with a time delay between each of the plurality of separable Doppler invariant signals.

11. The apparatus of claim 1, wherein the at least one source is a first source adapted to generate the plurality of separable Doppler invariant signals.

12. The apparatus of claim 1, wherein the at least one source is a plurality of physically separate sources adapted to generate the plurality of separable Doppler invariant signals.

13. The apparatus of claim 1, wherein the signal processing unit is adapted to determine a distance between the source and the receiver using the propagation time delay.

14. The apparatus of claim 1, wherein the at least one source is deployed near the surface of a body of water.

15. The apparatus of claim 14, wherein the at least one source is deployed on at least one of a buoy, a vessel, and a towed cable.

16. The method of claim 1, wherein generating the separable, modulated Doppler invariant signals comprises generating a plurality of orthogonal Doppler invariant signals.

17. The method of claim 16, wherein generating the plurality of orthogonal Doppler invariant signals comprises generating the plurality of orthogonal Doppler invariant signals using at least one of a Maximal sequence and a Kasami sequence.

18. A method for determining a propagation time delay, comprising:
   generating a plurality of separable, modulated Doppler invariant signals using at least one source;
   receiving the at least one modulated Doppler invariant signal with at least one receiver positioned along a seismic cable; and
   determining at least one propagation time delay from the source to the receiver using the modulated Doppler invariant signal and the received Doppler invariant signal.

19. The method of claim 18, wherein generating the separable, modulated Doppler invariant signals comprises generating a linear-period-modulated signal.

20. The method of claim 19, wherein generating the linear-period-modulated signal comprises generating the linear-period-modulated signal having a bandwidth of about 16 kHz for about 0.25 seconds.

21. The method of claim 18, wherein determining the propagation time delay from the source to the receiver using the separable, modulated Doppler invariant signals and the received Doppler invariant signal comprises cross-correlating the modulated Doppler invariant signal and the received Doppler invariant signal.

22. The method of claim 18, wherein determining the propagation time delay from the source to the receiver using the separable, modulated Doppler invariant signals and the received Doppler invariant signal comprises auto-correlating the modulated Doppler invariant signal.

23. The method of claim 18, wherein generating the plurality of separable, modulated Doppler invariant signals comprises generating the plurality of separable Doppler invariant signals substantially simultaneously.

24. The method of claim 18, wherein generating the plurality of separable, modulated Doppler invariant signals comprises generating the plurality of separable Doppler invariant signals with a time delay between each of the plurality of separable Doppler invariant signals.

25. The method of claim 18, further comprising determining at least one distance from the source to the receiver using the at least one propagation time delay.

* * * * *